United States Patent [19]

Demorat, Jr. et al.

[11] Patent Number: 4,864,458
[45] Date of Patent: Sep. 5, 1989

[54] ELECTROSTATIC DISCHARGE GROUNDING SWITCH AND METHOD OF OPERATING SAME

[75] Inventors: Gerald J. Demorat Jr., Endicott; William A. Weiler, Sr., Johnson City, both of N.Y.

[73] Assignee: IBM Corporation, Armonk, N.Y.

[21] Appl. No.: 281,412

[22] Filed: Dec. 8, 1988

[51] Int. Cl.[4] .............................................. H05F 3/02
[52] U.S. Cl. ....................................... 361/212; 439/91
[58] Field of Search ....................... 361/212, 220, 413; 439/91, 93; 174/51

[56] References Cited

U.S. PATENT DOCUMENTS

| | | | |
|---|---|---|---|
| 4,179,178 | 12/1979 | Bachman et al. | 439/59 |
| 4,272,143 | 6/1981 | Weiss | 439/266 |
| 4,377,315 | 3/1983 | Grau | 439/59 |
| 4,439,809 | 3/1984 | Weight et al. | 361/220 |
| 4,456,800 | 6/1984 | Holland | 361/220 |
| 4,510,553 | 4/1985 | Faultersack | 361/413 |
| 4,579,406 | 4/1986 | Laursen et al. | 439/62 |
| 4,726,775 | 2/1988 | Owen | 439/49 |
| 4,789,347 | 12/1988 | Banjo et al. | 439/93 X |
| 4,791,524 | 12/1988 | Teigen et al. | 361/212 |

Primary Examiner—L. T. Hix
Assistant Examiner—Brian W. Brown
Attorney, Agent, or Firm—William N. Hogg

[57] ABSTRACT

A switching device on a printed circuit card assembly is provided which permits the signal ground of the printed circuit card to be grounded to the machine ground during insertion of the card into the frame of the machine, and when the card is fully inserted the switch is opened to allow the signal ground of the card to be electrically isolated from the machine ground of the frame.

7 Claims, 1 Drawing Sheet

4,864,458

ELECTROSTATIC DISCHARGE GROUNDING SWITCH AND METHOD OF OPERATING SAME

BACKGROUND OF THE INVENTION

This invention relates generally to electrostatic discharge grounding switches and their method of operation, and more particularly to an electrostatic discharge switch mounted on a card assembly and coactable with the mounting frame to automatically discharge any electrostatic charge on the ground plane of the card as the card is inserted into the mounting frame. Near completion of insertion the switch is moved to an open position so that the card ground plane is insulated from the frame by the time the card is fully inserted.

In printed circuit board technology and especially in the technology involved in computers often a multiplicity of circuit cards and/or boards are utilized in the machine. It is usually required to provide the printed circuit card with a ground plane as a part of its structure and which ground plane is maintained at a signal ground potential which is different from the electrical potential of the mounting frame which is commonly called the machine ground potential. Thus, the ground plane of the cards have a signal ground different from the machine ground, and hence the card signal ground planes are insulated from the machine ground plane.

One of the problems encountered with printed circuit cards is that the signal ground planes tend to build up an electrostatic charge. Since this ground plane is maintained at a level different from that of the mounting frame and is insulated therefrom, when the card is inserted into the mounting frame the electrostatic discharge will not automatically be discharged to machine ground but may remain thereon. This can be especially harmful if the card is inserted into the connectors on the card while the machine is in operation.

There have been many prior art proposals for grounding of various cards, components, boards, cartridges and the like. For example U.S. Pat. No. 4,179,178 teaches a technique for grounding of the contacts on a game cartridge being inserted into a computer during insertion of the card, and thereafter offering the ground. This does not teach the grounding of a signal ground to a machine ground temporarily during card insertion and the patent which backs various schemes of grounding include U.S. Pat. Nos. 4,439,809; 4,456,800; and 4,510,553.

SUMMARY OF THE INVENTION

According to the present invention, a switch is provided on a printed circuit card which switch is actuated during the insertion of the card into a mounting frame such that during initial insertion, the signal ground plane of the card is electrically connected to the machine ground of the mounting frame to thereby discharge any electrostatic charge which has built up on the signal ground plane of the card and thereafter at final insertion position the switch is opened so as to open the connection between the mounting frame and ground plane of the card to thereby keep the signal ground plane of the card isolated from the machine ground of the mounting frame.

DESCRIPTION OF THE PREFERRED ENVIRONMENT

Figures 1, 2, 3, 4, 5:
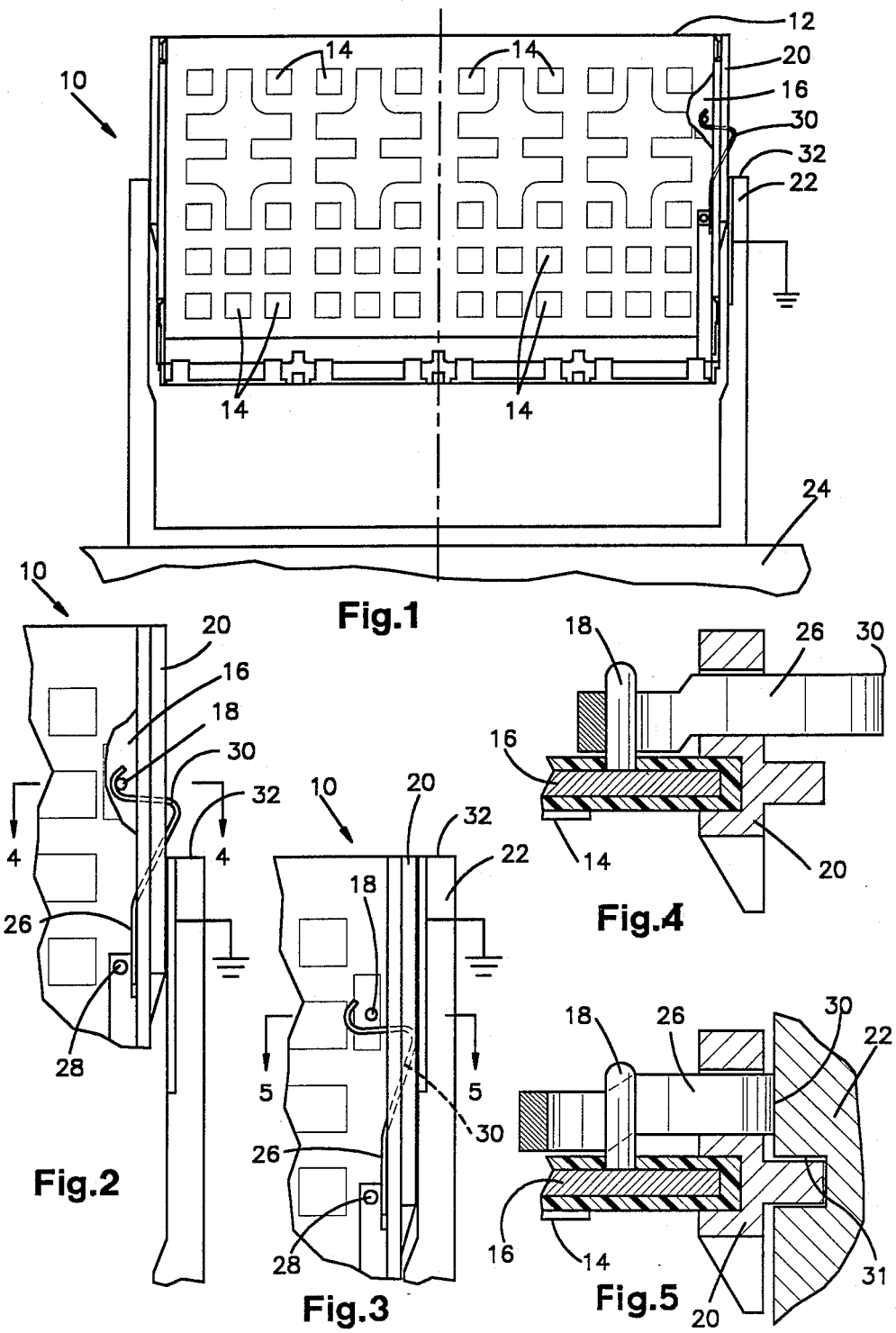
FIG. 1 is the front elevational view of a card assembly and mounting frame incorporating the electrostatic discharge switch according to this invention showing the card being inserted into the frame.
FIG. 2 is a detailed enlarged view of a portion of the assembly of FIG. 1 showing the switch position at initial insertion of the card assembly into the mounting frame.
FIG. 3 is a view similar to FIG. 2 showing the switch position when the card assembly is fully inserted into the mounting frame.
FIG. 4 is a sectional view taken substantially along the plane designated by line 4—4 of FIG. 2.
FIG. 5 is a sectional view taken substantially along the plane designated by the line 5—5 of FIG. 3.

Referring now to the drawing and for the present to FIG. 1, a card assembly 10 is shown which includes a printed circuit card 12 having various components 14 mounted thereon. The printed circuit card 12 is formed with a ground plane 16 (shown in partial section in FIG. 2) and a pin 18 which extends through the surface of the printed circuit card 12 and is in contact with the ground plane 16 of the card. This is often referred to as a "signal ground" and normally will be at a different potential from the frame of the machine which is referred to as "machine ground".

An electrically conductive card holder 20 is provided in which the printed circuit card 12 is mounted. One particularly good material for the card holder 20 is carbon filled polycarbonate, although many other materials can be used. The card holder secures the printed circuit card 12 in the desired relationship and allows it to be inserted to a mounting frame 22 which is secured to a substrate 24. Conventionally, the card assembly 10 will be provided with electrical connections to coact with connectors on the substrate 24.

A generally S-shaped spring member 26 is provided which preferably is made out of beryllium copper or some other material which has good electrical conductivity and good spring characteristics. The spring member 26 is secured by a rivet 28 to the conductive card holder 20 so as to establish electrical contact therebetween. The spring is so structured and configured that in its normal position as shown in FIGS. 1 and 2 it will be biased into contact with the pin 18 thereby establishing an electrically conductive path between the ground plane 14 and the card holder 20. The spring member 26 also has a central portion 30 which extends outwardly from the edge of the card holder 12 and is positioned to engage and be actuated by the top of the mounting frame 22 in slot 31 (FIG. 5) as will be described presently.

As shown in FIG. 2, as the card assembly 10 is inserted into the mounting frame 22, the card holder 20 is in sliding contact with the mounting frame 22 in slot 32 (See FIG. 5) which establishes an electrical path between the card holder 20 and the mounting frame 22. Since in its normal position, the spring member 26 is in contact with the pin ;8 as shown in FIGS. 1 and 2, the pin 18 and spring member 26 act as a switch which is closed thus establishing electrical contact or continuity between the signal ground plane 16 and the machine ground of the mounting frame 22. This will cause any electrostatic charge on the signal ground plane 16 to discharge to the machine ground of the mounting frame 22.

As the card assembly 10 is continued to be inserted into the frame, the central portion of the spring 30 will contact the edge 32 of the mounting frame 22 and the co-action between the frame 22 and the spring 26 will bias the spring 26 out of contact with the pin 18 thus opening or breaking contact or continuity between the mounting frame 22 and the signal ground plane 16. This is the position shown in FIG. 3 and the position of the spring 26 when the card assembly 10 is completely inserted into the mounting frame 22.

Thus, with the present invention, any electrostatic build-up on the signal ground plane 16 which might occur by virtue of people handling the card assembly or by virtue of the sliding of the card assembly either on insertion or removal from the holder or from any other source is automatically dissipated to machine ground through the pin 18 the spring 26, the card holder 20 to the frame 22.

While one embodiment of the invention has been shown and described, various adaptations and modifications can be made without departing from the scope of the invention as defined in the appended claims.

What is claimed is:

1. In a system wherein at least one printed circuit card assembly is insertable into a mounting frame maintained at a machine ground level and wherein said printed circuit card assembly has a ground plane which is maintained at signal ground level different from said machine ground level, the improvement which comprises;

switch means carried by said card assembly, said switch means having a closed position establishing a path to said signal ground plane and an open position, said switch means being normally biased to its closed position, said card assembly including electrical conducting means in circuit relationship with said switch means, said mounting frame having actuating means coactable with said electrical conducting means and said switch means when said card is inserted into said mounting frame;

whereby when said card assembly is inserted into said mounting frame upon initial contact of the mounting frame with said electrical conducting means any electrostatic charge on the signal ground plane of the card assembly will be dissipated to the machine ground plane of frame, and when the card assembly is inserted fully into the mounting frame, the signal ground plane of the card assembly will be isolated from the machine ground plane of the mounting frame.

2. The invention as defined in claim 1 wherein said switch means includes a resilient spring member coactable with said mounting frame.

3. The invention as defined in claim 1 wherein said card assembly includes a pin connected to card ground and disposed to contact said spring member in the switched closed position.

4. The invention as defined in claim 1 wherein said card assembly includes a conductive card holder which constitutes the electrical conducting means insulated from the signal ground plane, and wherein said spring is carried by said card holder and coactable with the mounting frame.

5. A method of discharging electrostatic charge from the signal ground plane of a printed circuit card assembly, and wherein said card assembly is insertable into a frame member, and wherein said card assembly has switch means having a closed position which provides a path to the ground plane of the card and an open position, comprising the steps of normally biasing said switch means to its closed position; inserting the card assembly into the support frame; causing said switch means to contact said frame member initially in its closed position to discharge electrical charge to the mounting frame; and thereafter, causing said switch to move to and stay in its open position when fully inserted and thereby isolate said signal ground plane of the card from the support frame.

6. The inventions defined in claim 5 wherein said switch means includes spring means actuatable by said support frame.

7. The invention defined in claim 6 wherein said switch means includes a pin carried by said card assembly in contact with said ground plane and coactable with its spring member, and wherein said spring member is moved out of contact with said pin at full insertion of the card assembly.

* * * * *